US011628741B2

(12) United States Patent
Basler et al.

(10) Patent No.: US 11,628,741 B2
(45) Date of Patent: Apr. 18, 2023

(54) METHOD, COMPUTER PROGRAM PRODUCT AND PROGNOSIS SYSTEM FOR DETERMINING THE WORKING LIFE OF A TRACTION BATTERY OF A VEHICLE (71) Applicant: Torqeedo GmbH, Wessling (DE)

(72) Inventors: Hendrik Basler, Munich (DE); Michael Daude, Egling (DE); Marc Hartmeyer, Munich (DE)

(73) Assignee: Torqeedo GmbH, Wessling (DE)

( * ) Notice: Subject to any disclaimer, the term of this patent is extended or adjusted under 35 U.S.C. 154(b) by 856 days.

(21) Appl. No.: 16/503,907

(22) Filed: Jul. 5, 2019

(65) Prior Publication Data
US 2020/0009988 A1 Jan. 9, 2020

(30) Foreign Application Priority Data

Jul. 6, 2018 (DE) .......................... 102018116472.6

(51) Int. Cl.
*B60L 58/16* (2019.01)
*G01R 31/392* (2019.01)
(Continued)

(52) U.S. Cl.
CPC .............. *B60L 58/16* (2019.02); *B63J 99/00* (2013.01); *G01R 31/367* (2019.01); *G01R 31/392* (2019.01); *G06F 30/20* (2020.01); *G07C 5/04* (2013.01); *G07C 5/085* (2013.01); *H01M 10/4285* (2013.01); *H01M 10/48* (2013.01);
(Continued)

(58) Field of Classification Search
CPC ........... B60L 2200/32; B60L 2240/545; B60L 58/16; B60Y 2200/91; B63B 79/00; G01R 31/367; G01R 31/392; G07C 5/04; G07C 5/085; H01M 10/4285; H01M 10/48;
(Continued)

(56) References Cited

U.S. PATENT DOCUMENTS 7,880,438 B1     2/2011 Cohen et al.
8,332,342 B1 *  12/2012 Saha ..................... G01R 31/392
                                                        706/45
(Continued)

FOREIGN PATENT DOCUMENTS

CN       104598716 A  *  5/2015
DE      102006000397 A1    2/2007
EP         3203574 A1     8/2017

OTHER PUBLICATIONS

"Operating Manual Ultralight 402," Sep. 15, 2009, 64 pages.
(Continued)

*Primary Examiner* — Daniel L Greene
(74) *Attorney, Agent, or Firm* — Greenberg Traurig, LLP; David J. Dykeman; Roman Fayerberg (57) ABSTRACT

The present disclosure relates to a method for determining the working life of a traction battery of a boat, including the steps of determining a system configuration and/or operating conditions of the boat, providing a traction battery model, which states an ageing condition of the traction battery as time progresses depending on the system configuration and/or operating conditions determining at least one condition that confirms the end-of-life condition of the traction battery has been reached and calculating the time-period until the end-of-life condition is reached on the basis of the traction battery model.

19 Claims, 6 Drawing Sheets

(51) Int. Cl.

| | | |
|---|---|---|
| *G01R 31/367* | (2019.01) | |
| *G06F 30/20* | (2020.01) | |
| *B63B 79/00* | (2020.01) | |
| *B63J 99/00* | (2009.01) | |
| *G07C 5/04* | (2006.01) | |
| *G07C 5/08* | (2006.01) | |
| *H01M 10/42* | (2006.01) | |
| *H01M 10/48* | (2006.01) | |

(52) U.S. Cl.
CPC ..... *B60L 2200/32* (2013.01); *B60L 2240/545* (2013.01); *B60Y 2200/91* (2013.01); *B63B 79/00* (2020.01); *H01M 2220/20* (2013.01)

(58) Field of Classification Search
CPC . H01M 10/482; H01M 2220/20; G06F 30/20; Y02E 60/10; Y02E 10/70; B63J 99/00
See application file for complete search history.

(56) References Cited

U.S. PATENT DOCUMENTS

| 8,855,954 | B1* | 10/2014 | Bickford | G01R 31/392 |
| | | | | 702/63 |
| 2003/0065366 | A1 | 4/2003 | Merritt et al. | |
| 2007/0029974 | A1* | 2/2007 | Uchida | G01R 31/3842 |
| | | | | 320/132 |
| 2007/0284163 | A1 | 12/2007 | Heap et al. | |
| 2008/0231284 | A1* | 9/2008 | Birke | B60L 58/12 |
| | | | | 324/426 |
| 2009/0167543 | A1* | 7/2009 | Bi | G08B 21/182 |
| | | | | 340/636.1 |
| 2012/0150378 | A1* | 6/2012 | Maini | H01M 10/4285 |
| | | | | 701/1 |
| 2015/0239365 | A1* | 8/2015 | Hyde | B60L 58/26 |
| | | | | 701/2 |
| 2016/0209472 | A1* | 7/2016 | Chow | G01R 31/367 |
| 2017/0106766 | A1* | 4/2017 | Duan | B60L 58/15 |
| 2018/0204393 | A1* | 7/2018 | Landolsi | B60L 58/10 |
| 2018/0309171 | A1* | 10/2018 | Qin | H01M 10/425 |
| 2019/0107406 | A1* | 4/2019 | Cox | G01S 19/42 |
| 2019/0176639 | A1* | 6/2019 | Kumar | B60L 3/0046 |
| 2020/0164763 | A1* | 5/2020 | Holme | B60L 58/10 |
| 2021/0178928 | A1* | 6/2021 | Ruppert | B60L 58/13 |

OTHER PUBLICATIONS

"Operating Manual Ultralight 403," Mar. 22, 2016, 72 pages.
"Torqeedo Katalog 2009," 2009, 24 pages.
"Torqeedo Katalog 2010," 2010, 24 pages.
"Torqeedo Katalog 2011," 2011, 24 pages.
"Torqeedo Katalog 2012," 2012, 32 pages.
"Torqeedo Katalog 2013," 2013, 21 pages.
"Torqeedo Katalog 2014," 2014, 46 pages.
"Torqeedo 2015," 2015, 64 pages.
"Torqeedo Electric Boating 2016," 2016, 74 pages.
"Torqeedo Electric Boating 2017," 2017, 76 pages.
"Torqeedo Electric Boating 2018," 2018, 76 pages.
Güldenring, Sabine, "Service Manual Ultralight 403 and 1103," Mar. 23, 2016, 17 pages.

* cited by examiner

METHOD, COMPUTER PROGRAM PRODUCT AND PROGNOSIS SYSTEM FOR DETERMINING THE WORKING LIFE OF A TRACTION BATTERY OF A VEHICLE

CROSS REFERENCE TO RELATED APPLICATIONS

This application claims priority to and the benefit of German Patent Application No. DE 10 2018 116 472.6, filed Jul. 6, 2018, the entirety of which is incorporated herein by reference.

TECHNICAL FIELD

The present disclosure relates to a method for determining the working life of a traction battery of a vehicle, in particular, a boat, a computer program product for carrying out the method and a prognosis system with such a computer program product.

BACKGROUND

Electrically powered watercraft, in particular boats, are designed with a rechargeable electric energy storage, for example in the form of a traction battery, which stores electric energy and provides the same for supplying an electric propulsion engine as required. Such energy stores are cost-intensive and typically have a working life that is shorter in comparison to the working life of the watercraft and the electric drive system itself.

Electric energy storages are subject to physical ageing which causes a decreasing efficiency with increasing operating time and time. The correct and safe operation of the electric drive system is therefore dependent on the ageing condition or the serviceability of the energy storage, which reduces with increasing age and operating time. Ageing effects of the electric energy storage depend on a plurality of different factors. In general, we can differentiate between so-called external factors affecting the operational environment of the boat and operational, so-called internal factors. The external factors influencing the ageing effects are for example the climate conditions of the area of use, in particular, the ambient temperature and humidity. The internal factors for example include the number of charging and discharging cycles, the age of the energy storage, the operating temperature of the energy storage, etc.

There is a plurality of methods for determining the ageing condition for energy storage, namely the serviceability of an electric energy storage. A reduction in storage capacity compared to the new condition of the energy storage can for example be used as a key figure for the ageing condition of the energy storage (engl.: "state of health"; abbreviation: SOH). A generally known method for the precise determination of serviceability envisages to first charge the electric energy storage completely and to then completely discharge the same in order to measure a prevailing storage capacity. With a less cost- and time-intensive method it is known to measure an internal resistance of the energy storage in order to then determine a prevailing ageing condition, i.e. an actual ageing condition.

The electric energy storage can, in particular, be adapted to the specific usage conditions and the envisaged usage behavior of the boat in order to ensure a cost-optimized electric drive system design that is fit for use. An optimized design of the electric drive system consequently requires a reliable prognosis of the ageing condition of the energy storage over its operating hours. In other words, there is a requirement for a method that predicts the ageing condition of the energy storage during operation as time progresses.

SUMMARY

The present disclosure provides an improved method that will enable a determination of the working life of a traction battery of a vehicle, in particular, a boat. The present disclosure is further based on the problem of providing a computer program product and a prognosis system for carrying out such a method.

In some embodiments, the problems are solved by a method, a computer program and a prognosis system for determining the working life of a traction battery of a vehicle, in particular, a boat. For example, in some aspects, there is provided a method for determining the working life of a traction battery of a vehicle, comprising the steps: determining one or more of a system configuration or operating conditions of a vehicle; providing a traction battery model, which states an ageing condition of the traction battery as time progresses depending on one or more of the system configuration or operating conditions; determining at least one condition that confirms the end-of-life condition of the traction battery has been reached; and calculating the time period until the end-of-life condition is reached on the basis of the traction battery model.

Such a method can advantageously be suitable for reliably predicting the ageing condition of the energy storage as time progresses even before its actual commissioning. Such a method can further also be suitable for use during the operation of the traction battery in order to determine a remaining working life of the traction battery. The point in time when the efficiency of the energy storage no longer meets the requirements placed on it and has thus reached the end of its working life is of particular interest for the prognosis of the ageing condition. The term "working life" is here understood as the period from start to end of the correct operation of the energy storage.

The special conditions on a boat can also be taken in consideration here with regard to ambient conditions as well as with regard to the necessity of providing a minimum range that will enable it to reach a harbor or land. This safety relevant requirement can differ from the requirements of land vehicles, where too short a range will rarely result in life-threatening situations.

Methods for determining an end-of-life condition of a battery, where operating parameters such as for example an output voltage are measured at different points in time after commencing operation of the battery, are known from US 2003/065366 A1 and U.S. Pat. No. 7,880,438 B1, incorporated herein by reference in their entireties. An estimation of the remaining battery working life is then based on this measurement.

A method for determining the working life of a traction battery of a vehicle, in particular, a boat, is consequently suggested. The method comprises the steps of determining a system configuration and/or operating conditions of the vehicle, the provision of a traction battery model that states an ageing condition of the traction battery as time progresses depending on the system configuration and/or operating conditions, and the determination of at least one condition that ascertains the reaching of an end-of-life condition of the traction battery. A calculation of the time-period until the end-of-life condition is reached is also carried out on the basis of the traction battery model.

The present disclosure is based on the discovery that an ageing of the traction battery is subject to the influence of a plurality of different factors. In addition to operational, so-called internal factors the working life of the traction battery is further influenced by so-called external factors, which affect the operational environment. More precisely the present disclosure has found that an envisaged use and an envisaged usage behavior of the vehicle with regard to the type, intensity and place of use can be taken into consideration for a reliable calculation of the working life of a traction battery. Consequently, the suggested method includes a determination of the system configuration and/or operating conditions, by means of which an envisaged use and an envisaged usage behavior of the vehicle can be illustrated. The provision of the traction battery model that uses the system configuration determined by the method and/or the operating conditions determined as input parameters is also suggested for stating the ageing condition of the traction battery as time progresses and to therefore predict the same. As a result, the method therefore allows a determination of the working life of a traction battery of a vehicle depending on the envisaged use and the envisaged usage behavior.

Compared to the methods known from prior art the solution suggested here allows a plurality of different factors, not taken into consideration to date, can now be taken into consideration during the calculation of the working life of a traction battery. This allows a user- and usage-specific determination of the working life of the traction battery, which improves the reliability and precision of the method.

The suggested method further allows that a determination of the working life of the traction battery can be carried out prior it is put into service. This is realized in that the method makes use of the traction battery model that calculates the time-period until the end-of-life condition is reached on the basis of the system configuration and/or operating conditions determined for the method. The method can for example be carried out with a prognosis system or a prognosis tool, for example in the form of a computer program product, which calculates the time-period until the end-of-life condition of a traction battery is reached even before the same is put into service or during the operation of the traction battery. Alternatively, or additionally the method can be carried out with a control unit or a battery management system in a drive system of the vehicle in order to monitor the ageing condition during the operation of the traction battery.

The term "system configuration" is here understood as a structural and functional construction of the electrically powered vehicle, in particular, the electric drive system including the traction battery. In particular, it is understood as the structural and functional design of individual system components and their cooperation.

The basic construction of an electrically powered vehicle, in particular, a boat, is known to the person skilled in the art from prior art and is therefore not described in detail here. An electrically powered vehicle generally comprises an electric drive system with at least one drive chain, which is connected with one or more consumers, in particular at least one propulsion engine, and supplies the same with electric energy. The number and the type of traction batteries used in a vehicle and their interconnection will depend on the type, the envisaged use and the typical applications of the vehicle and the electrical consumers installed in the same, among other things.

A traction battery normally comprises a plurality of battery cells, which can be interconnected in different ways. Correspondingly the vehicle can also have several drive batteries, which can also be interconnected with each other in different ways. The parallel switching of individual traction batteries or battery cells amongst the traction batteries increases their storage capacity and current carrying capacity. Compared to this a serial interconnection of individual traction batteries or battery cells can increase an output voltage.

The method step of determining the system configuration can therefore comprise a determination of the number of traction batteries and/or the battery type of individual traction batteries and/or the type of interconnection of the drive batteries. Alternatively, or additionally a determination of the number of battery cells in individual traction batteries and/or the type of interconnection of the battery cells inside the individual traction batteries can be carried out. A determination of the number and the type of the consumers connected with the at least one traction battery, in particular, the determination of at least one propulsion engine and/or further consumers, can also take place.

The ageing of the traction battery is further influenced by the charging type and method. A charger used for charging the traction battery offers information about the charging process of the traction battery here. The method step of determining the system configuration can consequently comprise a determination of a charger envisaged for use.

The electric drive system can comprise cooling for reducing a thermal load of the traction battery. This cooling can be envisaged for cooling the traction battery, in particular, during operation of the electric drive system or during a charging process of the traction battery. The method step of determining the system configuration can further comprise a determining of a presence and/or a type and/or a cooling capacity of said cooling for the traction battery.

The term "operating conditions" relates to information about the type, intensity and the place of operation as well as the use of the vehicle, in particular, the traction battery, in connection with the present disclosure. The operating conditions relate to external as well as internal factors that influence the ageing of the traction battery.

The method step of determining the operating conditions can comprise a determination of climate conditions, in particular, a climate profile of the envisaged region of use. In this way information about the ambient temperature and the humidity in the envisaged region of use of the vehicle can be determined, made available for the traction battery model, and taken into consideration when determining the working life of the traction battery A determination of a temperature and/or a temperature limitation prevailing in the traction battery can also be carried out alternatively or additionally. A temperature limitation for the traction battery can for example be stipulated by the cooling envisaged for the traction battery.

A determination of the operating cycles of the traction battery, in particular related to its charging and discharging processes, can also be carried out. The step of determining the charging processes can especially comprise a determination of a final charging voltage and/or a maximum battery cell temperature prevailing in the traction battery, in particular in the presence of cooling for the traction battery and/or a charging current. A determination of a discharging depth and/or a maximum battery cell temperature prevailing in the traction battery can take place when determining the discharging processes, in particular in the presence of cooling for the traction battery and/or an average and/or maximum power output and/or a period of maximum power output relative to an entire discharging period. A determination of a provisional number of discharging or charging cycles, in particular related to a specific time period, can also take place. A determination of a provisional average number of discharging or charging cycles for predefined time periods, preferably seasons of the year, can for example be carried out in this regard. The average number of discharging or charging cycles can differ for the different pre-defined time periods.

Alternatively, or additionally the method step of determining the operating conditions can comprise the determining of storage conditions of the traction battery. Storage conditions are here understood as the type and circumstances under which the vehicle, in particular the boat, or the traction battery are stored. Storage describes a circumstance of the vehicle or the traction battery under which these are not used or in service. It can be determined in this regard in which environment, in particular under which ambient conditions such as for example the ambient temperature, storage takes place. Alternatively, or additionally it can be determined in which charging condition (engl.: "state of charge", abbreviation: SOC) the traction battery is during storage.

The use of a vehicle and its ambient conditions typically vary depending on the seasons of the year or as the year progresses. In order to determine the operating conditions as precisely and realistically as possible and to keep the handling and determination of information simple at the same time the present method suggests, in some embodiments, that the determination of operating conditions is divided into individual seasons of the year. The determination of the operating parameters preferably takes place in such a way that information about the operating conditions are recorded separately for individual seasons of the year or months of the calendar year. Accordingly, the operating conditions for use of the vehicle or the traction battery can be illustrated in an easy-to-use way and recorded in a simple way.

The method step of determining the system configuration and/or operating conditions is preferably carried out on the basis of information transmitted by a user of the vehicle. Alternatively, or additionally the determining of the system configuration and/or operating conditions can be carried out on the basis of data of comparable and/or earlier applications. The system configurations and/or the operating conditions can also be determined on the basis of information already determined or available.

As described above the determined system configuration and the determined operating conditions serve as input parameters for the traction battery model. On the basis of this information an ageing condition of the traction battery as time progresses, namely a change in the ageing conditions or the serviceability of the traction battery over time, is then calculated by means of the traction battery model.

The traction battery model is preferably a mathematical model that illustrates the ageing condition of the traction battery depending on time. Accordingly, the traction battery model can be described as function that quantifies an ageing condition of the traction battery depending on the system configuration, on operating conditions and on time.

The traction battery model can be designed to state at least one parameter affecting the ageing condition of the traction battery as a function of time on the basis of the system configuration and/or on operating conditions for quantifying the ageing condition or the serviceability of the traction battery. The at least one parameter is preferably a specific value for the ageing condition or the serviceability of the traction battery. Alternatively, or additionally the at least one parameter can be an internal resistance and/or a useable capacity and/or a clamping voltage and/or a self-discharge feature and/or a number of charging and discharging cycles completed by the traction battery. In some embodiments the traction battery model can be designed for initially determining an internal resistance and/or a useable capacity and/or a clamping voltage and/or a self-discharge feature and/or a number of charging and discharging cycles completed by the traction battery as a function of time, and calculate a specific value for the ageing condition or the serviceability of the traction battery depending on the same. The specific value can for example be listed in percent, wherein a value of 100% displays a condition of the battery at the start of operation or prior to commissioning and a value of 0% an end-of-life conditions of the traction battery.

The specific value for the ageing condition can state a useable capacity relative to a starting capacity of the traction battery. The starting capacity here relates to a capacity of the traction battery at the start of its working life, i.e. prior to its commissioning. Alternatively, the specific value can be a number of charging and discharging cycles already completed relative to a threshold value for the number of charging and discharging cycles after which the end-of-life condition of the traction battery is reached.

As described earlier the traction battery model can be equipped for providing a prognosis for the ageing condition of the traction battery over its operating time. A prognosis-immanent deviation is typically present between a predicted result and an actually occurring result, which normally increases with increasing time distance related to a starting time of the prognosis. In order to account for these deviations, the traction battery model can be designed for stating a value range for the ageing conditions, in particular for the at least one parameter, depending on time, wherein a width of the value range in particular grows as time progresses. In other words, the traction battery model can be designed for stating a value range for the ageing condition for individual points in time within the working life.

The suggested method further comprises the step of determining at least one condition that determines the reaching of the end-of-life condition (engl.: end-of-life (EOL) state) of the traction battery. This method step takes account of the circumstance that different customer- and application-specific end-of-life conditions can be defined for different uses and applications of the vehicle. In general, an end-of-life condition of the traction batteries exists if their serviceability no longer fulfils the requirements placed on the traction battery and a reliable and usage-appropriate operation of the vehicle can therefore no longer be guaranteed. An end-of-life condition of the traction battery can for example be reached when a useable capacity relative to a starting capacity of the traction battery, in particular under stipulation of a constant continuous discharge performance, does not reach a value of for example substantially 80% or 87%, for example for specific applications of the vehicle.

In some embodiments of the method the determination of the at least one condition can comprise a determination of a threshold value for the ageing condition, in particular the at least one parameter. The threshold value preferably forms a value for the ageing condition, in particular the at least one parameter, upon reaching of which the end-of-life condition of the traction battery exists. For this the method can additionally comprise a step of determining a threshold value for the ageing condition, at which the threshold value is determined on the basis of the at least one condition determined with the method. This method step can for example be realized by the traction battery model. In other words, the traction battery model can be designed for determining a threshold value for the ageing condition on the basis of the at least one condition determined with the method, in particular the at least one parameter. Accordingly, it can be determined during the method step of calculating the time period until the end-of-life condition is reached at which point in time the threshold value is reached.

The stated ageing condition or the at least one stated parameter can be measured at the traction battery and compared with the predicted values at certain points during the working life of the vehicle to validate the method, in particular the traction battery model. Accordingly, the method can comprise a step of measuring the ageing condition or the at least one parameter at the traction battery. A comparison between the measured values and those stipulated by the traction battery model or those calculated can also take place. The traction battery model can be adjusted on the basis of the comparison between the calculated and the measured values for improving the method. Following adjustment of the method, in particular the traction battery model, the working life of the traction battery can be determined once more by means of the method. The comparison of the calculated and the measured values for the ageing condition and the adjustment of the method based on the same, in particular the traction battery model, can increase the accuracy and reliability of the determination of the working life of the traction battery in an application-specific as well as a cross-application way.

Validation can be carried out in such a way that the values for the ageing condition, in particular the at least one parameter provided by the traction battery model, are measured at one or more points in time during or at the end of the working life of the traction battery and are used for adjusting the method, in particular the traction battery model. More precisely the ageing condition stated by or calculated with the traction battery model, in particular the at least one parameter, can be measured during a charging process of the traction battery and/or during maintenance of the traction battery and/or following expiry of the calculated working life. The procedure can be validated and adapted after each of the above measurements and the life of the traction battery can then be reassessed. traction battery In some embodiments of the method operating conditions can be recorded during the working life of the traction battery. In some embodiments the method step of determining the operating conditions can comprise the recording of the same during the working life of the traction battery. The recorded operating conditions are preferably used for verifying, and if necessary adapting previously or initially determined operating conditions and/or the traction battery model. The working life of the traction battery can then be determined once more on the basis of adjusted operating conditions and/or the adjusted traction battery model. In this way the accuracy and the reliability of the method can be improved further.

In some embodiments, at least one parameter relating to the operating conditions can be divided into different value ranges and the total operating time of the traction battery recorded in every one of the operating conditions determined by the value ranges across the working life of the traction battery. In this way an efficient evaluation of the operating conditions can take place, which enables a comprehensive evaluation with a comparatively small data volume. The parameters to be recorded can be recorded at different points in time or at different frequencies.

The present disclosure further relates to a computer program product with a program code stored on a machine-readable data carrier for implementing the method described above when the computer program product is carried out by a data processing system. Technical features related to the above method therefore correspondingly relate to the computer program product described herein for carrying out the method. In particular, there is provided a computer program product with a program code stored on a machine-readable data carrier for carrying out the program code, the computer program product executed by a data processing system to: determine one or more of a system configuration or operating conditions of a vehicle; provide a traction battery model, which states an ageing condition of the traction battery as time progresses depending on one or more of the system configuration or operating conditions; determine at least one condition that confirms the end-of-life condition of the traction battery has been reached; and calculate the time period until the end-of-life condition is reached on the basis of the traction battery model.

A prognosis system for determining the working life of a traction battery of a vehicle, in particular a boat, is also provided, which comprises a data carrier, on which the computer program product described above is stored. The prognosis system further comprises a prognosis unit, in particular a data processing system, for implementing the computer program product stored on the data carrier. Technical features related to the computer program product therefore correspondingly relate to the prognosis system described here. In particular, in some embodiments, there is provided a prognosis system for determining the working life of a traction battery of a vehicle comprising: a data carrier with a computer program product stored therein; and a prognosis unit for carrying out the computer program product stored on the data carrier to: determine one or more of a system configuration or operating conditions of a vehicle; provide a traction battery model, which states an ageing condition of the traction battery as time progresses depending on one or more of the system configuration or operating conditions; determine at least one condition that confirms the end-of-life condition of the traction battery has been reached; and calculate the time period until the end-of-life condition is reached on the basis of the traction battery model.

The data carrier of the prognosis unit can be encompassed on a web server.

The prognosis unit can be designed for accessing the web server in a decentralized way and for carrying out computer program products stored on the data carrier, and correspondingly the above-mentioned method for determining the working life of a traction battery of a vehicle.

BRIEF DESCRIPTION OF THE FIGURES

Specific non-limiting embodiments of the present disclosure are explained in more detail with reference to the description of the following Figures. These show schematically.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

Non-limiting examples of the present methods and systems will be described as follows with reference to the Figures.

Figure 1:
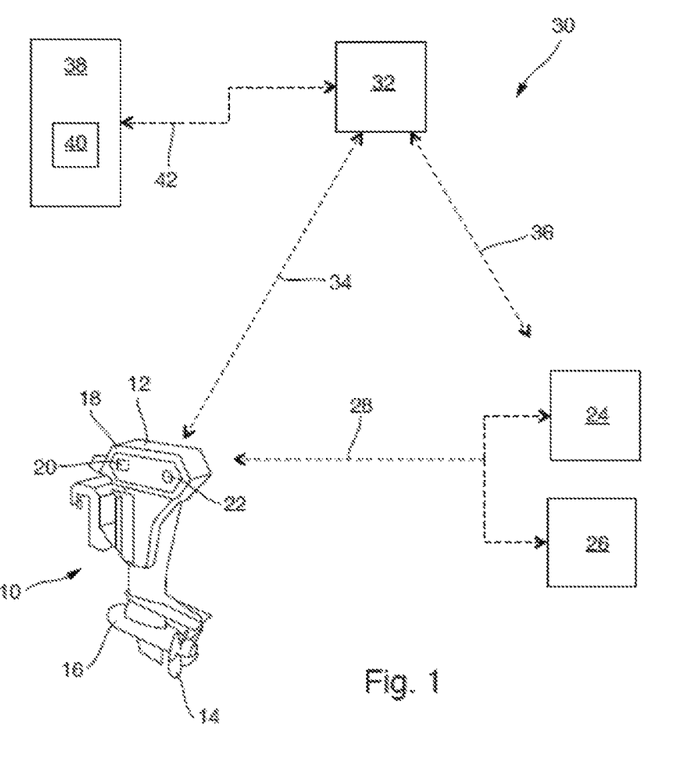
FIG. 1 is a schematic of an electric drive system of an electrically driven boat and a prognosis system for determining the working life of a traction battery of the drive system.

FIG. 1 schematically shows an electric drive system 10 in the form of an outboard engine of a boat. The electric drive system 10 comprises a traction battery 12, which is connected with a propulsion engine 16 driving a ship's propeller 14 and further electric consumers of the electric drive system 10 not shown here and supplies these with electric energy. The traction battery 12 is disconnectably fitted in a housing 18 of the electric drive system 10. The drive system 10 further comprises a battery management system 20 connected with a display mounted on the electric drive system 10 to be visible for a user and designed for calculating specific values of the traction battery 12, such as for example a current ageing condition, i.e. a serviceability (abbreviated: SOH value) of the traction battery 12, a provisional or remaining working life of the traction battery 12, a charging condition of the traction battery 12 (abbreviated: SOC value) etc., and to display these on the display.

The drive system has an interface 22, via which the traction battery 12 can be connected with a charger 24 for electrical charging. The charger 24 is designed for measuring at least one parameter of the traction battery 12 relating to the ageing condition 12 and for transmitting the measured values for the parameter together with a point in time for the respective measurement to the battery management system 20 via the interface 22. The charger 24 is especially designed for measuring an internal resistance of the traction battery 12, which increases with an advancing ageing condition of the traction battery 12.

The interface 22 is further equipped for connecting the drive system 10 with a measuring unit 26, which is equipped for calculating at least one parameter or specific value displaying the current ageing condition, and for transmitting the values calculated in this way to the battery management system 20. More precisely the measuring unit 26 is equipped for measuring a useable capacity and an internal resistance of the traction battery 12 and for transmitting the same together with a point in time of the measurement to the battery management system 20 via the interface 22. This can for example take place in that the measuring unit 26 first completely charges the traction battery 12 and then completely discharges the same with a stipulated constant continuous discharge performance. In other words, by measuring a useable capacity the measuring unit 26 can determine an actual state of ageing condition of the traction battery. Alternatively, the measuring unit 26 can be equipped for carrying out another suitable measuring method.

The exchange of information via the interface 22 between the electric drive system 10, in particular the battery management system 20, and the respective charger 24 and the measuring unit 26 is indicated by means of the broken lines 28 in FIG. 1.

A prognosis system 30 is also shown in FIG. 1, which is designed for determining the working life of the traction battery 12. The prognosis system 30 comprises a prognosis unit 32 in the form of a data processing system, which can be connected with the drive system 10 via the interface 22 or a further interface not shown here for exchanging information as indicated in FIG. 1 by means of a broken line 34. The prognosis unit 32 can also be connected with the charger 24 as well as with the measuring unit 26 for exchanging information, as is indicated in FIG. 1 by means of a further broken line 36. More precisely the prognosis unit 32 is equipped for receiving the values measured by the charger 24 and the measuring unit 26 for the parameters relating to the ageing condition of the traction battery 12.

The prognosis system 30 further comprises a web server 38 with a machine-readable data carrier 40, on which a computer program product is stored. The prognosis unit 32 is connected with the web server 38 as indicated by means of a further broken line 42 in FIG. 1, and is equipped for accessing and implementing the computer program product provided on the data carrier 40. The computer program product constitutes a web-based software, which can be accessed by the prognosis unit 32 for carrying out a method for determining the working life of the traction battery 12. In other words, the computer program product comprises a program code stored on the data carrier for carrying out the method for determining the working life of the traction battery when the computer program product is implemented by the prognosis unit 32.

The prognosis unit 32 is in particular a decentralized data processing system, for example in the form of a personal computer, which accesses the web server for carrying out the computer program product. In other words, the prognosis unit 32 is designed for accessing the web server 38 in a decentralized way in order to carry out the computer program product stored on the data carrier 40. This has the advantage that the computer program product, and therefore the method for determining the ageing condition underlying the same, can be centrally administered and adjusted.

Figure 2:
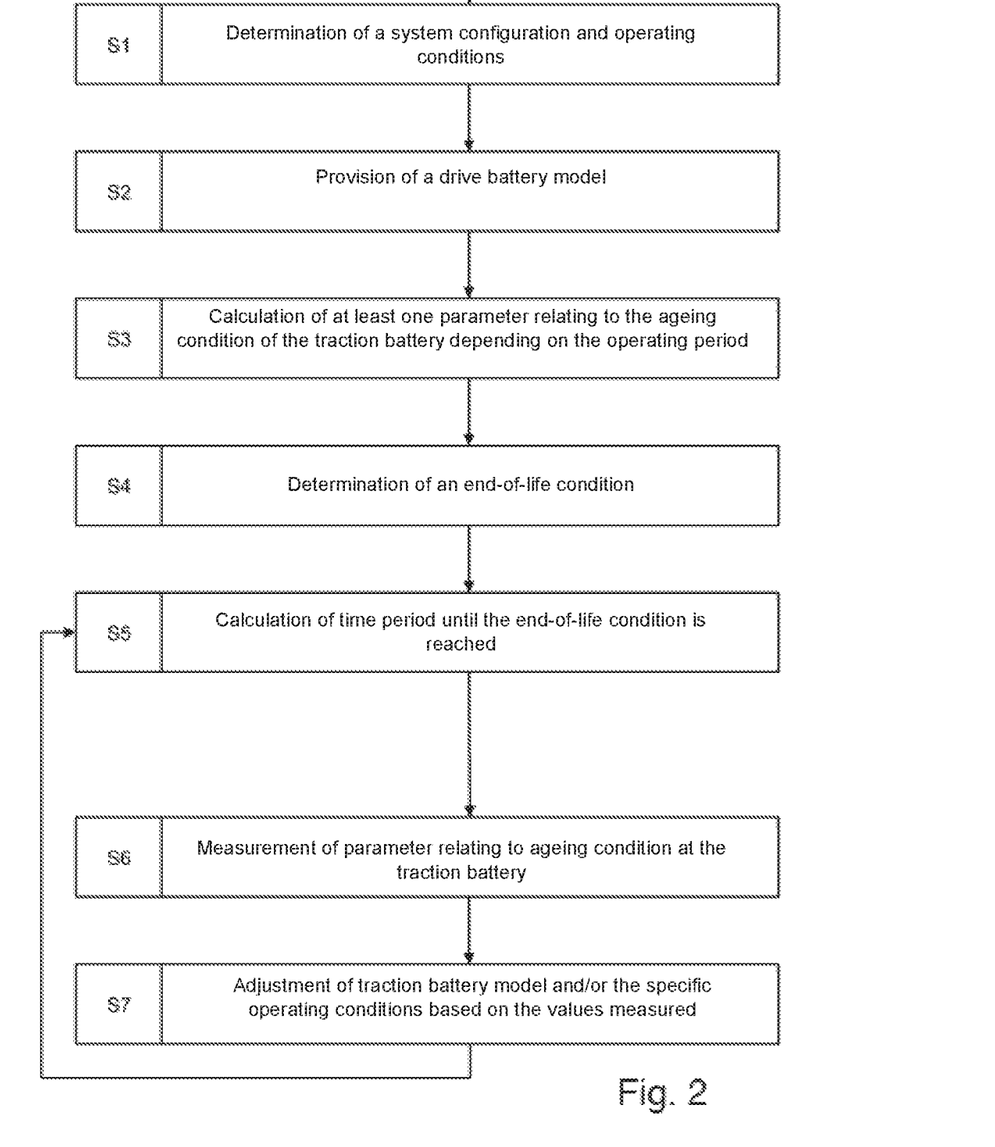
FIG. 2 is a flow chart of a method to be carried out with the prognosis system for determining the working life of the traction battery.

With reference to FIG. 2 the method to be carried out by the prognosis unit 32 for determining the working life of the traction battery 12 is explained in more detail as follows. The prognosis unit 32 can here be activated by a user prior to putting into service or during the operation of the traction battery 12 to carry out the method for determining the working life of the traction battery 12. In other words, by executing the method by the prognosis unit 32, the prognosis unit 32 calculates the estimated operating time after which an end-of-life condition of the traction battery 12 is reached.

Due to the high acquisition costs of the traction battery 12 it is known to rent or lease the traction battery 12 when purchasing an electric drive system 10. This can provide a basis for calculating customer- and application-specific financing models in that the prognosis unit 32 calculates an estimated working life of the traction battery 12. The prognosis unit 32 further offers the possibility of an interpretation of the electric drive system, in particular the traction battery, that is fit for use and cost-optimized.

In the method shown in FIG. 2 an application- and customer-specific calculation of the time period until the end-of-life condition is reached is carried out. This is ensured in that the calculation of the method is carried out with reference to a system configuration and operating conditions of the boat or the electric drive system 10. The method consequently comprises a first step S1 of determining a system configuration and operating conditions of the boat.

In the present embodiment example this is realized by entering data concerning the system configuration and the operating conditions into the prognosis unit 32. The prognosis unit 32 comprises a graphic user interface and an input means for this, via which the user enters the data concerning the system configuration and the operating conditions into the prognosis unit 32.

An entry of data by the user takes place with regard to the system configuration to be determined in step S1:

The number of traction batteries 12;
the battery type of the respective traction battery 12;
the type of interconnection of the drive batteries, for example whether these are interconnected in parallel or in series;
the number of interconnection of battery cells within the respective traction battery 12;
the features, in particular capacity, and/or the type of the propulsion engine 16;
further consumers within the drive system 10, in particular a totaled capacity of the further consumers during the operation of the drive system 10;
the charger 24 used for charging the traction battery 24;
a maximum current strength induced during charging the traction battery 12 by the charger; and/or
a cooling system for cooling the traction battery 12, which ensures a maximum operating temperature of the traction battery 12.

The entry of data by the user also takes place with regards to the operating conditions to be determined in step S1 with regard to:

an envisaged region of use or an envisaged place of use of the boat, on the basis of which the prognosis unit determines a temperature profile, i.e. a progression of the temperature over the year;
a maximum or minimum temperature to be maintained inside the traction battery 12 through cooling or by means of a heater;
an envisaged number of operating cycles; and/or
storage conditions of the traction battery 12.

The entry of the envisaged number of operating cycles can be realized in such a way that a respective number of operating cycles is entered by the user for the respective seasons of the year, i.e. spring, summer, autumn and winter. In this way the entry of operating conditions can be simplified for the user, whilst the operating conditions can however be illustrated sufficiently precisely at the same time. The user can for example estimate and enter an average number of operating cycles per week for every season of the year.

In a subsequent step S2 of the method a provision of a traction battery model takes place, which states an ageing condition of the traction battery 12 as time progresses, i.e. depending on time, and depending on the system configuration and/or operating conditions. More precisely the traction battery model is a mathematical model that quantifies an ageing condition of the traction battery 12 depending on the system configuration, operating conditions and operating period. The traction battery model is included in the computer program project. The provision of the traction battery model is consequently realized in that the prognosis unit 32 accesses the web server 38 and the computer program product stored on the same.

Figure 3:
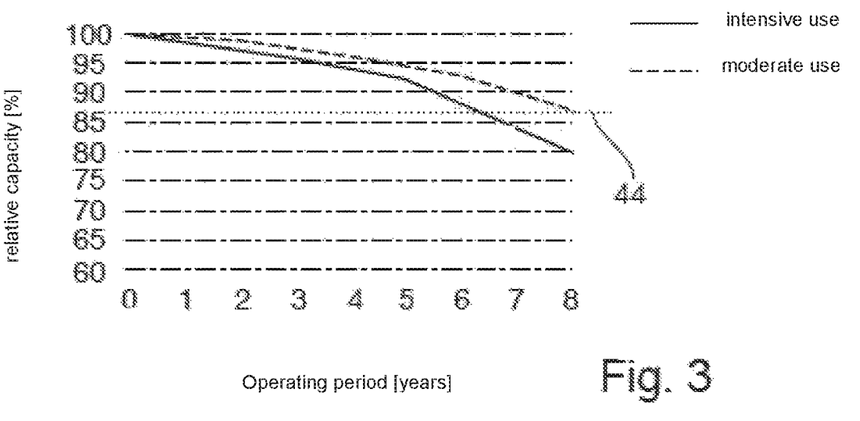
FIGS. 3, 4, and 5 are diagrams illustrating parameters and specific values calculated with the method for the ageing condition of the traction battery as time progresses.
Figure 4:
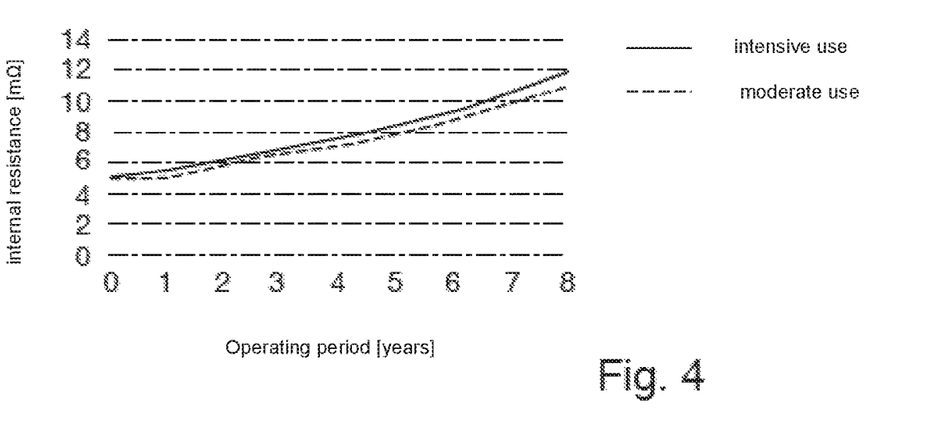

In a third method step S3 a calculation of at least one parameter relating to the ageing condition of the traction battery 12 or a specific value as a function of time takes place by means of the traction battery model. This especially takes place on the basis of the system configuration and operating conditions determined in step S1. In the embodiment example shown here the traction battery model calculates a relative capacity as a parameter, as shown in FIG. 3, and an internal resistance of the traction battery 12, as shown in FIG. 4, as time progresses. The relative capacity describes a relationship between a currently available or usable capacity relative to a starting capacity of the traction battery 12, i.e. a capacity prior to its commissioning, whilst stipulating a constant continuous discharge performance. The relative capacity thus forms a specific value for the ageing condition of the traction battery 12.

FIG. 3 especially shows a diagram, in which the relative capacity calculated by the traction battery model is shown as time progresses. The ordinate of the diagram shows the relative capacity in percent and the abscissa of the diagram the operating time in years. As the efficiency of the traction battery 12 decreases with increasing age, the usable and thus the relative capacity of the traction battery 12 falls accordingly, as illustrated in FIG. 3. Intensive use of the traction battery 12 therefore results in a faster decrease in the relative efficiency compared to moderate use.

FIG. 4 shows a corresponding diagram in which the internal resistance of the traction battery 12 calculated by the traction battery model is shown as time progresses. The ordinate of the diagram shows the internal resistance in mΩ and the abscissa of the diagram the operating time in years. An increasing value for the internal resistance here shows an increasing ageing of the traction battery 12. A more intensive use consequently results in a faster increase of the internal resistance compared to a moderate use of the traction battery 12.

As is clear from the diagrams in FIGS. 3 and 4 the traction battery model is equipped for determining a minimum and maximum value for the parameters that can be expected for the respective points in time, which accordingly illustrate a moderate or intensive use of the traction battery 12. In this way the change of the respective parameter for moderate as well as intensive use of the traction battery 12 is illustrated for the user. A value corridor that widens as time progresses or a value range for the parameters is therefore stated. Prognosis-immanent uncertainties during the calculation of the parameters and specific values can also be taken account in this way.

The method further comprises a fourth step S4 of determining at least one condition that confirms the reaching of an end-of-life condition of the traction battery 12. This take place in that the user sets a threshold value for at least one parameter calculated by the traction battery model and transmits this to the prognosis unit 32 via the graphic interface and the input means. The set threshold value is therefore a value that indicates that the traction battery 12 is in an end-of-life condition when the parameter calculated by the traction battery model reaches the threshold value.

In the embodiment example shown here the user sets a threshold value for the relative capacity, i.e. the usable capacity relative to the starting capacity of the traction battery 12 as a condition indicating that the end-of-life condition has been reached. The threshold value set by the user can for example substantially be 87% as indicated by means of a dotted line 44 in FIG. 3. In other words, an end-of-life condition of the traction battery 12 is reached as soon as the actual useable capacity of the traction battery 12 shows a value of 87% of the starting capacity of the traction battery 12 at a stipulated constant discharge current. Alternatively, or additionally the user can set a threshold value for the internal resistance of the traction battery 12 as a condition to indicate that the end-of-life condition has been reached.

Figure 5:
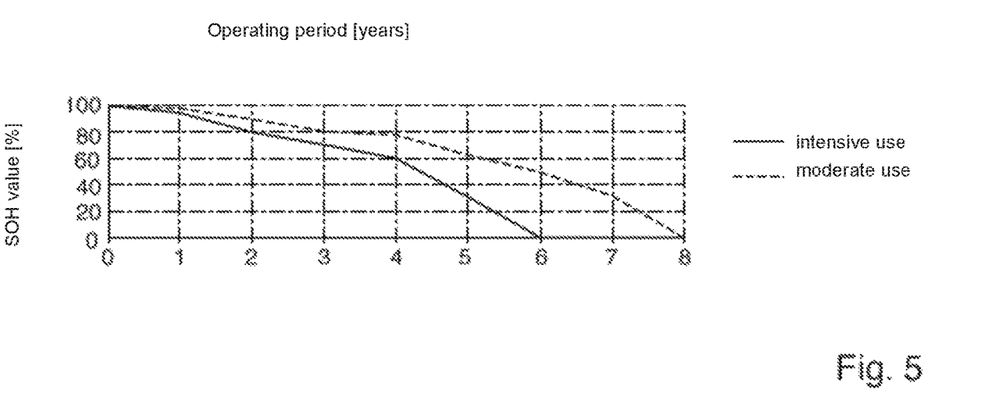

In a further step S5 of the method a calculation of the time-period until the end-of-life condition is reached then follows on the basis of the ascertained conditions and the calculated parameters as a function of time. For both moderate and intensive use of the traction battery 12, a time-period until the end-of-life condition is reached, i.e. the specified limit value, is calculated, as shown in FIG. 5.

The prognosis unit 32, is further equipped for calculating a further specific value for the ageing condition, the SOH value, as time progresses on the basis of the previously calculated parameters, in particular the relative capacity and/or the internal resistance and the end-of-life condition status. The calculated SOH value as time progresses is illustrated in the diagram according to FIG. 5. The ordinate of the diagram shows the SOH value in percent, wherein a value of 100% states the starting condition of the traction battery 12, i.e. at the start of its operation or prior to commissioning of the traction battery 12, and a value of 0% the end-of-life condition of the traction battery 12. The abscissa of the diagram shows the operating period in years. Alternatively, different or several SOH values can be calculated on the basis of the respective previously calculated parameters, i.e. the relative capacity and the internal resistance. A first SOH value can for example be determined on the basis of the relative capacity, and a second SOH value on the basis of the internal resistance. For this, special conditions are set for the respective calculated parameters, which indicate that the end-of-lie condition of the traction battery 12 has been reached.

According to the calculated parameters an SOH value each is calculated for the respective points in time of the operating period for moderate as well as for intensive use. In this way a value corridor or value range that widens as time progresses is stated for the SOH value. The time-period until the end-of-life condition is reached varies correspondingly along with the differentiation between moderate and intensive use. As ageing of the traction battery 12 will progress faster with intensive use the working life of the traction battery 12 is correspondingly shorter. As is clear from FIG. 5 the present embodiment example of the method lists an operating period of approximately 8 years for moderate use of the traction battery 12 and an operating period of approximately 6 years as a time-period for reaching the end-of-life condition of the traction battery 12 with intensive use.

The previously described method steps S1 to S5 can be carried out prior to commissioning as well as during the operation of the traction battery 12 for determining the working life, in particular the remaining working life of the traction battery 12.

It is further envisaged in the method for validating and adjusting the working life calculated by the prognosis unit 32 to measure the parameters calculated by the prognosis unit 32 during operation of the traction battery 12, to compare the measured values with the predicted values, and to adjust the method for determination or the traction battery model to the working life on the basis of this comparison.

For this a measuring of the parameters relating to the ageing condition takes place on the traction battery 12 in a method step S6, in particular, of the internal resistance and the useable or relative capacity. The drive system 10 is connected with the charger 24 or the measuring unit 26, which are equipped for measuring the internal resistance of the traction battery 12, for measuring the internal resistance of said traction battery 12. This can for example take place during a charging process. The drive system 10 is correspondingly connected with the measuring unit 26, which is designed for measuring the useable or relative capacity, for measuring the useable capacity of the traction battery 12. Measuring the useable or relative capacity can for example take place during maintenance of the traction battery 12 and/or after the calculated working life has expired. The values measured by the charger 24 and the measuring unit 26 are subsequently transmitted to the battery management system 20 via the interface 22 and stored there with reference to the operating period at the point in time of the measurement. The values measured in this way can also be transmitted to the prognosis unit 32. In a next step the parameters measured by the charger 24 and the measuring unit 26 for the values of the ageing condition are compared with the values calculated by the prognosis unit. This takes place by means of the prognosis unit 32.

The battery management system 20 is further designed for measuring and recording operating conditions during the operating period, i.e. the working life of the traction battery 12. The data measured in this way is also described as so-called "logging data". For this, parameters identifying operating conditions such as for example a current value, a temperature and the SOC value of the traction battery 12, are first divided into different value ranges as shown in Table 1. The different value ranges here identify different operating conditions of the traction battery 12. Based on this the battery management system 20 is designed for recording a total operating period of the traction battery 12 in each operating condition set by each of the value ranges over the working life of the traction battery 12.

TABLE 1

| Current | Temperature | SOC |
|---|---|---|
| <−220 A | <−10° C. | <5% |
| −220 . . . −181 A | −10 . . . 0° C. | 5 . . . 20% |
| −180 . . . −101 A | 0 . . . 10° C. | 20 . . . 50% |
| −100 . . . 20 A | 11 . . . 20° C. | 50 . . . 60% |
| −20 . . . 0 A | 21 . . . 30° C. | 60 . . . 70% |
| 0 . . . 10 A | 31 . . . 40° C. | 70 . . . 95% |
| 11 . . . 60 A | 41 . . . 50° C. | 95 . . . 100% |
| 61 . . . 100 A | 51 . . . 60° C. | |
| >100 A | >60° C. | |

In addition, the battery management system 20 is designed for recording further parameters identifying the operating conditions, in particular, the number of operating cycles, cell temperature, a storage voltage, a discharge degree, a pack voltage and a maximum cell difference, at periodic points in time, for example every 8 hours, also in a switched-off condition of the traction battery 12. The parameters recorded by the battery management system 20 are then made available to the prognosis unit 32.

The prognosis unit 32 is designed for comparing the values recorded by means of the battery management system 20 with the values determined for the operating condition in method step S1.

Based on the above comparisons between the initially determined or calculated parameters and those measured or recorded during operation an adjustment of the traction battery model and/or the determined operating parameters then takes place in a method step S7. This is realized by means of the prognosis system 30. The reliability of the method, and therefore the accuracy of the calculated working life until the end-of-life condition is reached, can be improved in this way.

Following the adjustment of the traction battery model and/or the determined operating parameters in method step S7, method step S5 of calculating the time-period, in particular the remaining time period until the end-of-life condition is reached, can then be carried out once more.

The prognosis unit 32 is further designed for calculating the data and values relating to the parameters identifying the operating conditions provisionally to be recorded by the battery management model on the basis of the traction battery model, and for transmitting these to the battery management system 20. The predicted values relating to the ageing condition and the parameters identifying the operating conditions are thus transmitted to the battery management system 20.

The battery management system 20 further receives the values measured by the charger 24 and the measuring unit 26 for the parameters of the ageing condition relating to the point in time of the measurement. As described before, the battery management system 20 also records the parameters that are characteristic for the operating conditions during operation.

In other words, the respective predicted values as well as the measured or recorded values for the respective parameters during operation of the drive system 10 are therefore available to the battery management system 20. The battery management system 20 is here designed for comparing the values recorded or measured during operation with the calculated values, and to assess on the basis of this comparison whether the time period calculated by the prognosis unit 32 until the end-of-life condition is reached will provisionally be complied with or not. If the number of recorded operating cycles for example exceeds a number of operating cycles predicted by the prognosis unit 32 at a specific point in time during operation, the battery management system 20 will show that an actual use of the drive system 10 is higher compared to an originally planned working life, so that the provisional time period until the end-of-life condition of the traction battery 12 is reached will be shorter than the one calculated by the prognosis unit 32. The battery management system 20 is designed for adjusting the value transmitted by the prognosis unit 32 for the time-period until the end-of-life condition is reached on the basis of this comparison, and for displaying the value adjusted in this way to the user via the display.

The battery management system 20 can further be designed for determining a serviceability of the traction battery 12. The serviceability can, for example, be a range or an operating period for different operating conditions of the boat, such as for example moderate or intensive use. The determination of the serviceability can be carried out on the basis of the calculated or predicted SOH value or the calculated or predicted parameters as time progresses, which are transmitted by means of the prognosis unit 32 and/or on the basis of the parameter measured by means of the charger 24 or the measuring unit 26, in particular the relative capacity and the internal resistance and/or on the basis of the parameters measured or recorded by the drive system 10. The specific serviceability can be displayed to the user of the boat via the display. In other words, the values predicted by the prognosis unit 32 and/or the values measured by the measuring unit 26 and/or the charger 24 can be used by the battery management system 20 for determining a specific value for the serviceability, in particular, a range or an operating period, depending on different operating modes of the boat.

Figure 6:
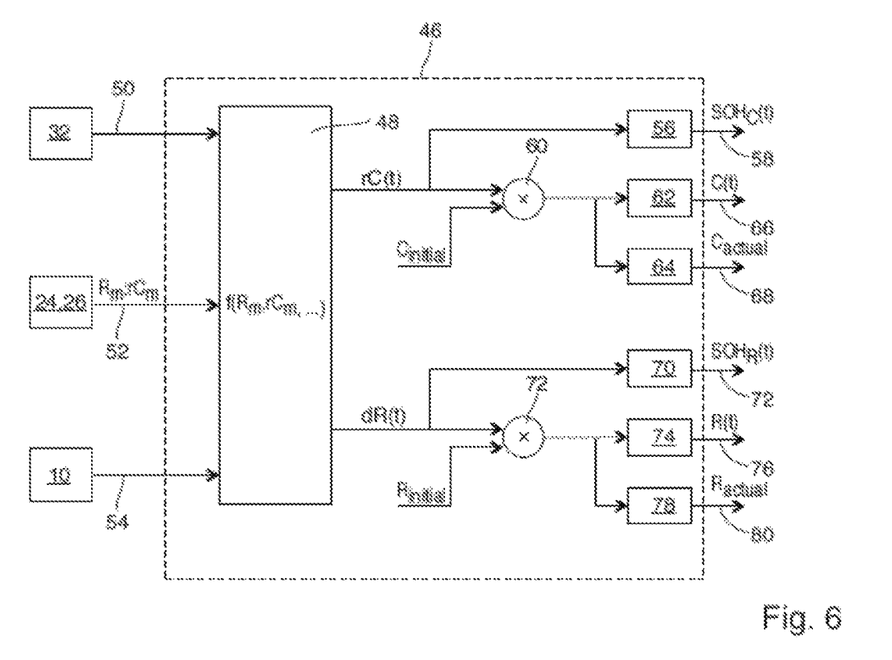
FIG. 6 presents an embodiment of the traction battery model.

FIG. 6 shows an embodiment of the traction battery model 46 in the form of a block diagram, which comprises an ageing model for the traction battery 12. The traction battery model 46, in particular, comprises a mathematical model 48 in the form of a function or an algorithm, which calculates a first SOH value, $SOH_C$, relating to a relative capacity of the traction battery 12, and a second SOH value, $SOH_R$, relating to an internal resistance of the traction battery 12, as time progresses depending on a plurality of input parameters.

The input parameters for the mathematical model 48 are described in more detail as follows with reference to FIG. 6. The mathematical model 48 is provided with the system configuration relating to the boat and the operating conditions relating to use of the boat as indicated by means of the arrow 50 in FIG. 6. This can be realized by means of the prognosis unit 32. Values measured for the relative capacity $rC_m$ and the internal resistance R. of the traction battery 12 are also transmitted to the mathematical model 48 as indicated by means of the arrow 52 in FIG. 6, which are calculated by the charger 24 and/or the measuring unit 26 and transmitted to the traction battery model 46. The values measured during operation of the traction battery 12 for the parameters relating to the ageing condition are read out of the drive system 10 and transmitted to the traction battery model 46 as indicated by arrow 54 in FIG. 6. Values relating to a storage period, a storage voltage, a load current, in particular, a discharge current and a charge throughput, a cell temperature and/or a discharge degree can be measured by the battery management system 20 in this regard and transmitted to the traction battery model 46.

On the basis of these input parameters, the mathematical model 48 calculates the relative capacity rC of the traction battery 12 as time progresses, i.e. rC(t), and transmits this value to a first processing unit 56, which calculates a first SOH value, $SOH_c$, as time progresses, from the same and issues it for further processing as indicated by arrow 58 in FIG. 6. The values for the relative capacity rC(t) of the traction battery 12 calculated by the mathematical model 48 are then transmitted to a second processing unit 60. The second processing unit 60 further receives a value for the starting capacity $C_{initial}$ of the traction battery 12, which equals a value for the capacity of the traction battery 12 in a new condition, in particular prior to commissioning, and multiplies the same with the value determined by the mathematical model 48 for the relative capacity rC(t). The values calculated in this way are then transferred to a third and a fourth processing unit 62, 64. The third processing unit 62 calculates a rest capacity of the traction battery 12 as time progresses, i.e. C(t) and, as indicated by arrow 66 in FIG. 6, issues this for further processing. The fourth processing unit 64 however determines a prevailing rest capacity $C_{actual}$ of the traction battery 12 and issues this as indicated by arrow 68 in FIG. 6.

The mathematical model 48 is further designed for determining an internal resistance increase depending on time, dR(t), on the basis of the input parameters mentioned above, and to transfer the calculated values to a fifth processing unit 70. The fifth processing unit 70 is designed for calculating the second SOH value, $SOH_R$, as time progresses and for issuing the same for further processing as indicted by arrow 72 in FIG. 6. The values calculated by the mathematical model 48 for the internal resistance increase dR(t) are further transmitted to a sixth processing unit 72. The sixth processing unit 72 then receives an initial internal resistance value $R_{initial}$ for the traction battery 12, which equals a value for the internal resistance of the traction battery in a new condition, in particular prior to its commissioning, and multiplies this with the values for the internal resistance increase dR(t). The value calculated in this way is transferred to a seventh processing unit 74, which determines the internal resistance of the traction battery 12 as time progresses, R(t), and issues the same for further processing as indicated by arrow 76 in FIG. 6. The values calculated by the sixth processing unit 72 are then transferred to an eighth processing unit 78, which calculates a prevailing internal resistance value $R_{actual}$ of the traction battery 12 and issues the same for further processing as indicated by arrow 80.

Figure 7:
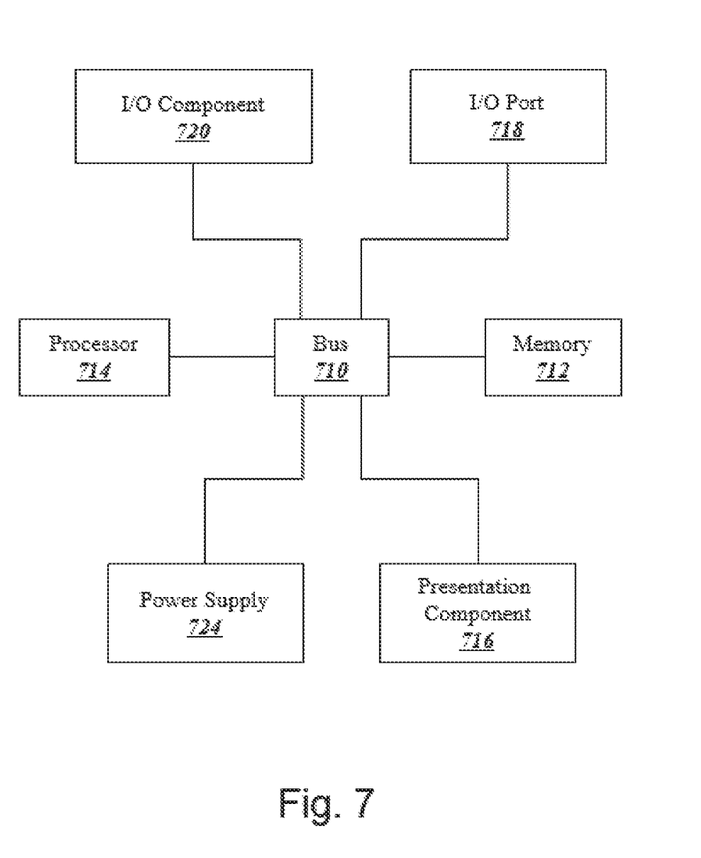
FIG. 7 is a diagram of a high-level architecture for implementing processes in accordance with aspects of the present disclosure.

Any suitable computing device can be used to implement the computing devices of the present disclosure (for example, 26, 32, 38) and methods/functionality described herein and be converted to a specific system for performing the operations and features described herein through modification of hardware, software, and firmware, in a manner significantly more than mere execution of software on a generic computing device, as would be appreciated by those of skill in the art. One illustrative example of such a computing device 700 is depicted in FIG. 7. The computing device 700 is merely an illustrative example of a suitable computing environment and in no way limits the scope of the present disclosure. A "computing device," as represented by FIG. 7, can include a "workstation," a "server," a "laptop," a "desktop," a "hand-held device," a "mobile device," a "tablet computer," or other computing devices, as would be understood by those of skill in the art. Given that the computing device 700 is depicted for illustrative purposes, embodiments of the present disclosure may utilize any number of computing devices 700 in any number of different ways to implement a single embodiment of the present disclosure. Accordingly, embodiments of the present disclosure are not limited to a single computing device 700, as would be appreciated by one with skill in the art, nor are they limited to a single type of implementation or configuration of the example computing device 700.

The computing device 700 can include a bus 710 that can be coupled to one or more of the following illustrative components, directly or indirectly: a memory 712, one or more processors 714, one or more presentation components 716, input/output ports 718, input/output components 620, and a power supply 724. One of skill in the art will appreciate that the bus 710 can include one or more busses, such as an address bus, a data bus, or any combination thereof. One of skill in the art additionally will appreciate that, depending on the intended applications and uses of a particular embodiment, multiple of these components can be implemented by a single device. Similarly, in some instances, a single component can be implemented by multiple devices. As such, FIG. 7 is merely illustrative of an exemplary computing device that can be used to implement one or more embodiments of the present disclosure, and in no way limits the present disclosure.

The computing device 700 can include or interact with a variety of computer-readable media. For example, computer-readable media can include Random Access Memory (RAM); Read Only Memory (ROM); Electronically Erasable Programmable Read Only Memory (EEPROM); flash memory or other memory technologies; CDROM, digital versatile disks (DVD) or other optical or holographic media; magnetic cassettes, magnetic tape, magnetic disk storage or other magnetic storage devices that can be used to encode information and can be accessed by the computing device 700.

The memory 712 can include computer-storage media in the form of volatile and/or nonvolatile memory. The memory 712 may be removable, non-removable, or any combination thereof. Exemplary hardware devices are devices such as hard drives, solid-state memory, optical-disc drives, and the like. The computing device 700 can include one or more processors that read data from components such as the memory 712, the various I/O components 716, etc. Presentation component(s) 716 present data indications to a user or other device. Exemplary presentation components include a display device, speaker, printing component, vibrating component, etc.

The I/O ports 718 can enable the computing device 700 to be logically coupled to other devices, such as I/O components 720. Some of the I/O components 720 can be built into the computing device 700. Examples of such I/O components 720 include a microphone, joystick, recording device, game pad, satellite dish, scanner, printer, wireless device, networking device, and the like.

While the presently disclosed embodiments have been described with reference to certain embodiments thereof, it should be understood by those skilled in the art that various changes may be made and equivalents may be substituted without departing from the true spirit and scope of the presently disclosed embodiments. In addition, many modifications may be made to adapt to a particular situation, indication, material and composition of matter, process step or steps, without departing from the spirit and scope of the present presently disclosed embodiments. Where applicable all individual features illustrated in the embodiment examples can be combined with and/or exchanged for each other without leaving the scope of the present disclosure.

The invention claimed is:

1. A method for determining a working life of a traction battery of a boat, comprising:
   determining, by at least one processor and based on a received envisaged region of use of the boat, climate conditions of the received envisaged region of use to determine operating conditions of the boat;
   calculating, by the at least one processor and based on a traction battery model comprising a mathematical model, an ageing condition of the traction battery as time progresses depending on the operating conditions;
   determining, by the at least one processor, at least one condition that confirms an end-of-life condition of the traction battery has been reached; and
   calculating, by the at least one processor and on a basis of the ageing condition determined by the traction battery model comprising the mathematical model, a time period until the at least one condition is reached.

2. The method according to claim 1, wherein determining of the operating conditions comprises a determination of one or more a temperature prevailing in the traction battery, a temperature limit, or of operating cycles.

3. The method according to claim 1, wherein determining of the at least one condition comprises a determination of a threshold value for the ageing condition upon reaching of which the end-of-life condition of the traction battery exists, wherein calculating of the time period until the end-of-life condition is reached determines at what point in time the threshold value is reached.

4. The method according to claim 1, wherein the operating conditions are recorded during one or more of the working life of the traction battery and the traction battery model or the operating conditions are adjusted on the basis of recorded operating conditions.

5. The method according to claim 1, wherein a parameter of the operating conditions is divided into different value ranges and total operating time of the traction battery is recorded in each operating condition determined by value ranges over the working life of the traction battery.

6. The method according to claim 1, wherein calculating the ageing condition comprises:
- determining, by the at least one processor, a system configuration by determining one or more of a number of traction batteries, a battery type, an interconnection of traction batteries, a number of interconnections of battery cells within the traction battery, a type and number of consumers, or a charger for the traction battery; and
- calculating, by the at least one processor and based on the traction battery model comprising the mathematical model, the ageing condition of the traction battery as time progresses depending on one or more of the system configuration or the operating conditions.

7. The method according to claim 6, where the battery type and the number of consumers comprises one or more of a propulsion engine or further consumers.

8. The method according to claim 1, wherein the traction battery model includes at least one parameter relating to the ageing condition of the traction battery as a function of time on the basis of the operating conditions.

9. The method according to claim 8, wherein the at least one parameter is one or more of a specific value for the ageing condition, an internal resistance, a useable capacity, a clamping voltage, a self-discharge feature, or a number of charging/discharging cycles of the traction battery.

10. The method according to claim 9, wherein the specific value for the ageing condition states the useable capacity relative to a starting capacity of the traction battery.

11. The method according to claim 10, wherein the specific value for the ageing condition states the useable capacity relative to the starting capacity of the traction battery under stipulation of a constant continuous discharge performance.

12. The method according to claim 1, wherein the traction battery model states a value range for the ageing condition.

13. The method according to claim 12, wherein the traction battery model states the value range for the ageing condition for at least one parameter depending on time.

14. The method according to claim 12, wherein a width of the value range increases as time progresses.

15. The method according to claim 8, wherein the ageing condition or the at least one parameter is measured at the traction battery during the working life of the boat at specific points in time, and is compared with values determined by the traction battery model—at these points in time, and the traction battery model—is adjusted on the basis of this comparison.

16. The method according to claim 15, wherein the ageing condition stated by the traction battery model or the at least one parameter is measured at one or more of the traction battery during a charging process, maintenance of the traction battery or following expiry of the working life.

17. A computer program product with a program code stored on a non-transitory machine-readable data carrier for carrying out the program code, the computer program product executed by a data processing system to:
- determine, based on a received envisaged region of use of a boat, climate conditions of the received envisaged region of use to determine operating conditions of the boat;
- calculate, based on a traction battery model comprising a mathematical model, an ageing condition of a traction battery as time progresses depending on the operating conditions;
- determine at least one condition that confirms an end-of-life condition of the traction battery has been reached; and
- calculate, on a basis of the ageing condition determined by the traction battery model comprising the mathematical model, a time period until the at least one condition is reached.

18. A prognosis system for determining a working life of a traction battery of a boat comprising:
- at least one processor; and
- at least one storage medium having encoded thereon executable instructions that, when executed by the at least one processor, cause the at least one processor to carry out a method, the method comprising:
  - determining, based on a received envisaged region of use of the boat, climate conditions of the received envisaged region of use to determine operating conditions of the boat;
  - calculating, based on a traction battery model comprising a mathematical model, an ageing condition of the traction battery as time progresses depending on the operating conditions;
  - determining at least one condition that confirms an end-of-life condition of the traction battery has been reached; and
  - calculating, on a basis of the ageing condition determined by the traction battery model comprising the mathematical model, a time period until the at least one condition is reached.

19. The prognosis system according to claim 18, wherein:
- the at least one storage medium is encompassed on a web server; and
- the at least one processor is designed for accessing the web server to operate in a decentralized way to implement the executable instructions stored on the at least one storage medium and access the web server.

* * * * *

UNITED STATES PATENT AND TRADEMARK OFFICE
CERTIFICATE OF CORRECTION

| | |
|---|---|
| PATENT NO. | : 11,628,741 B2 |
| APPLICATION NO. | : 16/503907 |
| DATED | : April 18, 2023 |
| INVENTOR(S) | : Hendrik Basler, Michael Daude and Marc Hartmeyer |

It is certified that error appears in the above-identified patent and that said Letters Patent is hereby corrected as shown below:

In the Claims

On Column 20, Line 47-48, please delete the following text: "for accessing the web server"

Signed and Sealed this
Twentieth Day of June, 2023

Katherine Kelly Vidal
*Director of the United States Patent and Trademark Office*